United States Patent [19]
Geske

[11] 3,994,010
[45] Nov. 23, 1976

[54] HALL EFFECT ELEMENTS
[75] Inventor: Marvin L. Geske, Minnetonka, Minn.
[73] Assignee: Honeywell Inc., Minneapolis, Minn.
[22] Filed: Mar. 27, 1975
[21] Appl. No.: 562,622

[52] U.S. Cl. .................................................. 357/27
[51] Int. Cl.² ........................................... H01L 27/22
[58] Field of Search ........................................ 357/27

[56] References Cited
UNITED STATES PATENTS

| | | | |
|---|---|---|---|
| 3,448,353 | 6/1969 | Gallagher et al. | 357/27 |
| 3,522,494 | 8/1970 | Bosch | 357/27 |
| 3,573,571 | 4/1971 | Brown | 357/27 |
| 3,714,523 | 1/1973 | Bate | 357/27 |
| 3,823,354 | 7/1974 | Janssen | 357/27 |

*Primary Examiner*—Edward J. Wojciechowicz
*Attorney, Agent, or Firm*—Theodore F. Neils

[57] ABSTRACT

A Hall effect element is provided with a reduced area while maintaining satisfactory performance. Further, there is provided a Hall effect element with improved long term stability through use of an equipotential plane.

20 Claims, 7 Drawing Figures

HALL EFFECT ELEMENTS

BACKGROUND OF THE INVENTION

The present invention relates to Hall effect magnetic sensors and particularly to ones provided in monolithic integrated circuits.

As is well known, minimizing the surface area of a monolithic integrated circuit chip is very desirable for the purpose of improving yield. To reduce this area requires that the number of component devices used be reduced, often an undesirable method, or that the areas taken up by each of the component devices be reduced or, perhaps, that a closer packing of the component devices on the chip be achieved or some combination of these. In Hall effect magnetic sensors which are constructed using monolithic integrated circuit techniques, the Hall effect element often takes a substantial amount of surface area on the monolithic integrated circuit chip in which it is provided.

Reducing the area of the Hall effect element has heretofore led to a substantial degradation in the parameters characterizing the Hall element. For example, reducing the distance between the power terminals in the Hall element leads to a drop in resistance between these terminals and, hence, to a larger energization current to maintain a given voltage potential between these terminals. However, the width cannot be made two narrow with respect to the length if a satisfactory voltage output between the signal terminals of the Hall element is to be obtained. Thus, reducing the length or width dimensions to reduce the integrated circuit chip surface area to any great extent taken by a conventional rectangular Hall element leads to performance impairments. Further limits concerning the area of an integrated circuit Hall element exist because of the minimum area which must be taken up in providing electrical contacts to the element due to the size of these diffusions and contacts.

SUMMARY OF THE INVENTION

The present invention provides a Hall effect element using power contacts having effective electrical contact areas which are of a small dimension compared to the separation between the signal contacts, at least in a direction sustantially parallel to the direction defined by the separation between the signal contacts. The Hall effect element may be provided in a monolithic integrated circuit to have a minimum stress response when properly oriented along a particular direction in the semiconductor material of the monlithic integrated circuit which is not parallel to an easy cleavage direction of this semiconductor material. Then the final configuration of a Hall effect element that is to have its major outline in a quadrilateral figure, can be determined in part by having the opposite sides of the quadrilateral perpendicular and parallel to the easy cleavage direction. A metallization portion can be provided over an insulating layer which in turn has been provided over a Hall effect element for use in stabilizing the Hall effect element output voltage occurring between its signal contacts. A rectangular Hall element with widened ends and a widened middle portion can also provide some of the advantages of the Hall element described above.

DESCRIPTION OF THE PREFERRED EMBODIMENTS

Figure 1:
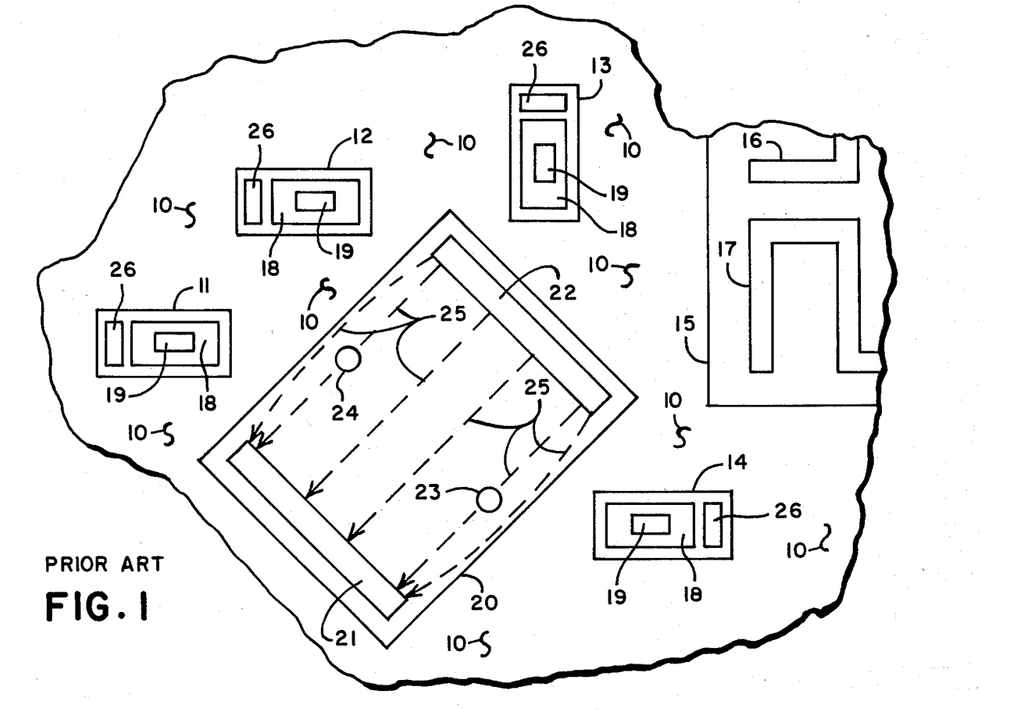
FIG. 1 shows a top view of a portion of a monolithic integrated circuit known in the prior art, shown with certain structural omissions.

FIG. 1 shows a portion of a silicon material monolithic integrated circuit omitting the usual metallization used and omitting the usually used insulating layer, typically a silicon dioxide layer, which is provided over the silicon material in which the component electrical system devices shown are provided. Hence, the lines shown represent the outlines of diffused and undifffused regions used to provide the component electrical devices in the integrated circuit portion shown. These devices are formed in an n-type conductivity epitaxial layer, a major surface of which is viewed in FIG. 1, the view shown being after component device fabrication has occurred. The outlines generally represent where p–n junctions intersect the major surface shown in FIG. 1. The areas shown between the component devices formed within the major outlines represent isolating regions used in junction isolating the component devices used in the integrated circuit. These isolating regions are formed by a $p^+$-type conductivity diffusion and are marked with the numeral 10.

Among the component devices shown are bipolar transistors, these being designated 11, 12, 13, and 14. Also shown is an isolated region 15 for the formation of diffused resistors therein. These resistors, 16 and 17, are formed during the base diffusions for the bipolar transistors. The bases of the transistors formed with the resistors 16 and 17 are all designated 18 while the emitters of the transistors are all designated 19. Surrounding each base 18 and the resistors 16 and 17 are n-type conductivity regions formed from the n-type conductivity silicon epitaxial layer by the diffusion of isolating regions 10. For the transistors, these n-type conductivity regions surrounding the base 18 serve as collectors so that the major outline of these collectors, formed by the p-n junction resulting between them and the isolating regions 10, is also the major outline for the transistors themselves. Within the collector regions are the collector contact diffusions, all designated 26.

Region 15, surrrounding the p-type conductivity resistors 16 and 17, serves to isolate these resistors and the p-n junction resulting between region 15 and resistors 16 and 17 forms the major outline of the resistors. A p-n junction also results between region 15 and isolating regions 10.

The final component device shown is a Hall effect element magnetic sensor designated by the numeral 20. The major outline of this Hall element is again a p-n junction, that being the junction resulting between the n-type conductivity Hall element and the p-type conductivity isolating regions 10 provided to isolate this Hall element. Within Hall element 20 are power contact diffusion regions, regions 21 and 22, and signal contact diffusion regions, regions 23 and 24. These regions and the collector contact diffusion regions 26 are formed by diffusion simultaneously with the emitters 19. They all have n+-type conductivity to enable good ohmic contacts to be made thereto and hence to the Hall element by the interconnection metallization network. The contact diffusion regions on Hall element 20 determine the effective electrical contact area in the surface of the Hall element because of their high electrical conductivity and because the actual metallization contact to the n-type conductivity silicon is confined to be within such regions. The relationship of the isolating regions 10, the Hall element 20 and the contact diffusion regions 21–24 in a monolithic integrated circuit structure are shown in some more detail in similar integrated circuit structure shown in FIG. 5.

The major outlines of the transistors and the major outline of isolated region 15 for the resistors can be seen from FIG. 1 to the quadrilateral figures, or more specifically, rectangles with the straight sides therein either parallel or perpendicular to one another. Such relationships between the major outlines of these pervasively used component devices facilitate providing the component devices in a very close "packing" relationship with one another and thus aid in keeping the surface area of the isolating regions 10 which perform no electrical circuit functions to a minimum. Further, such relationships between the component devices major outlines allow the edges of the monolithic integrated circuit chip to follow substantially straight lines without adding appreciably to the isolating regions 10. These straight line edges can be made parallel to the easy cleavage direction occurring in the silicon epitaxial layer and in the silicon substrate upon which the epitaxial layer is formed. The easy cleavage direction occurs along certain crystallographic planes in the silicon material lattice over which the silicon material parts relatively easily in response to applied stress thereacross, particularly where the stress is concentrated by scribing. Thus, the monolithic integrated circuit wafer can be easily scribed along the easy cleavage direction in the silicon material along the more or less aligned component device outlines for those component devices near the desired chip edge and subsequently cleaved with a minimum of damage to the resulting monolithic integrated circuit chips.

However, the Hall element is oriented askew to the remainder of the component devices in the surface shown in FIG. 1 which clearly reduces the "packing" density of the component devices about Hall element 20 and results in the isolating regions 10 surrounding the Hall element 20 having a substantial surface area. This orientation of the Hall element is necessitated, however, by the characteristics of the silicon material in which the Hall element is provided. Hall element 20 can be regarded as a four-terminal silicon material resistor with current provided to energize the Hall element through two terminals and with the voltage response of the Hall element measured between the two other terminals. Considering just the power contacts, these also define a two-terminal resistor. Both of these resistors in general are piezoresistive and will change with certain applied stresses generally, depending on the orientation of the resistors and the stresses with respect to the crystallographic axis of the material.

Stress is applied to the monolithic integrated circuit chip when mounted on a support due to temperature changes affecting the support and the chip differently and to direct mechanical stress inputs with a substantial portion of this stress being longitudinally applied along the mounting face of the chip. These stresses, due to the piezoresistive characteristics of silicon resistors noted above, can cause unwanted output voltage components to appear between the output voltage response terminals of the Hall element, i.e. the signal contacts.

Were the integrated circuit shown complete in FIG. 1, including the metallization contacts to the contact regions 21–24, and the final monolithic integrated circuit were energized, the current flow might be that shown along illustrative current paths 25 in the absence of a magnetic field directed into the surface (meaning into either side thereof) of Hall element 20 viewed in FIG. 1. With the symmetry of the illustrative current paths 25 shown, the Hall element output voltage between signal contact diffusions 23 and 24 would be zero (except for an offset voltage, see below) as both of these diffusions would be at the same potential with respect to either power contact diffusion 21 or 22. In the presence of a magnetic field directed into the shown surface of Hall element 20, the sample current paths would lose the symmetry shown in FIG. 1 and a voltage output would be developed between signal contact diffusions 23 and 24 in normal operation proportional to the magnetic field strength present.

There will also be an offset voltage component present between diffusions 23 and 24 as part of the voltage output, either arising unavoidably or arising by intention due to an assymmetrical placement of signal contact diffusions 23 and 24 with respect to diffusions 21 and 22. This offset voltage component arises with or without the presence of any magnetic field and does not vary proportionally to the magnetic field strength of any such field occurring through the surface of the Hall element.

A further component in this Hall element output voltage between signal contact diffusions 23 and 24, in addition to the magnetic field response voltage and the offset voltage, can occur as noted above, as a result of stresses of the type mentioned above being applied to the monolithic integrated circuit chip. This component is undesirable as it varies unpredictably and so is an error component in the Hall element output voltage. Because of the nature of the crystal structure of silicon, there occur certain directions of minimum electrical response to stress in the silicon with respect to which errors in the Hall element voltage output due to stress inputs will be minimized should the Hall element be properly oriented with respect to these directions. Thus arises the need to orient conventional Hall element 20 shown in FIG. 1 askew to the remaining component devices shown, as the direction for a minimum stress response is, in general, not parallel to the easy cleavage direction in the silicon, at least in the surface of the silicon as seen in FIG. 1. That surface is planar and is a [100] crystallographic plane. The axis of the Hall element 20, the one parallel to the separation length in the surface between the power contact diffusions 21 and 22, is directed 45° away from the easy cleavage direction in FIG. 1 and is in the (110) crystallographic direction.

The result is that most of the current along illustrative current paths 25 flows parallel to this Hall element axis because of the power contact diffusions 21 and 22 being nearly as wide as is Hall element 20. This results in a Hall element output voltage between signal contact diffusions 23 and 24 being relatively unresponsive to those stresses mentioned above which will occur in a monolithic integrated circuit chip, a condition which is necessary for satisfactory Hall element operation.

Not only does the askew orientation of the conventional Hall element 20 reduce the component device "packing " density in the major surface of the monolithic integrated circuit viewed in FIG. 1, but also this conventional element heretofore took a substantial portion of the area of that surface itself to obtain a satisfactory sensitivity and to obtain a sufficiently large internal resistance between the power contact diffusions to minimize the current required to energize this Hall element in operation. A typical Hall element of the conventional type, such as shown in FIG. 1, capable of achieving a sensitivity greater than 6 millivolts i) per kilogauss of magnetic field strength directed into the surface shown in FIG. 1 and ii) per volt of potential drop between power contact diffusions 22 and 21, requires around 200 square mils of surface area normally. The major outlines of this Hall element might reasonably have dimensions of approximately 16 mils by 13 mils. The power contact diffusions 21 and 22 are, at best with usual fabrication methods, kept approximately within 2 mils of the nearest side of the Hall element major outline and parallel to the sides at the ends of the Hall element. Diameters of the signal contact diffusions are approximately 1 mil and they similarly are kept within 2 mils of the nearest major outline sides of the Hall element device. The resistance of the two-terminal resistor between the power contact diffusions 21 and 22, in sheet resistance terms, is approximately one square.

Figure 2:
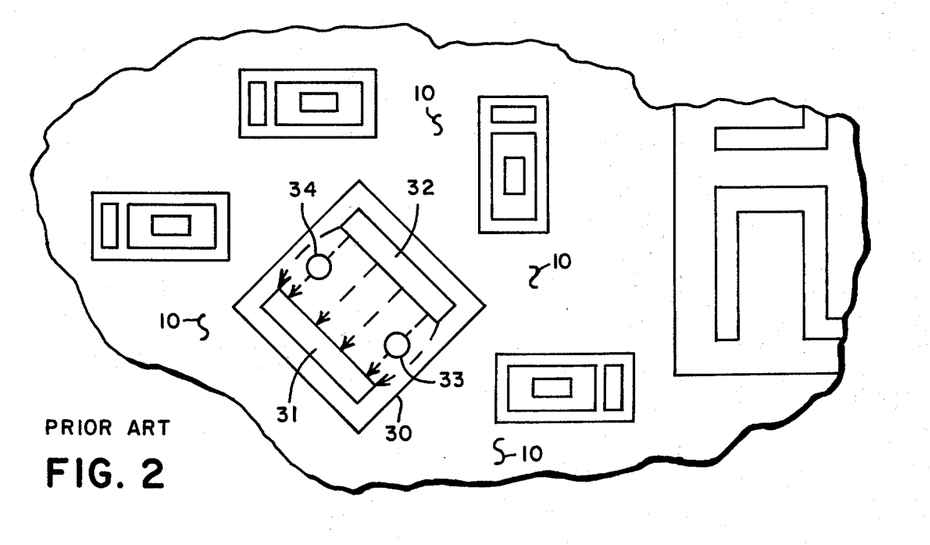
FIG. 2 shows a top view of a portion of a different monolithic integrated circuit with the same omissions as in FIG. 1 and also known in the prior art.

As indicated above, reducing the area taken by the Hall element in FIG. 1 would be very desirable. Use of a small Hall element is shown in FIG. 2, marked 30. The power contact diffusions are marked 31 and 32 and the signal contact diffusions are marked 33 and 34. This smaller unit was constructed to take only approximately 60 square mils with each side being approximately 8 mils in length.

Reducing the Hall element area is constrained, as mentioned above, by rather severe limitations on the length to width ratios which can be used with the Hall elements shown in FIGS. 1 and 2 and so in how area reductions can be achieved in conventional Hall element designs. Reducing the separation length of the power contact diffusion, i.e. the effective length of the Hall element, reduces the resistance between these diffusions. Reducing the separation length between the signal contact diffusions, i.e. the width of the Hall element, reduces the Hall output voltage. There is also no substantial gain in increasing the width of the Hall element as the Hall element output voltage tends to rise to only some saturation level with increasing width and, of course, the resistance between the power diffusion contacts drops with increasing width. Hence, conventional Hall elements such as in FIGS. 1 and 2 are designed to have major outlines which are square to only moderately rectangular in figure.

The various contact diffusions, however, cannot be scaled down to the same degree as the major Hall element outline because of limitations in the usual fabrication methods and the separation between the contact diffusions and the nearest major outline side cannot be reduced much at all either for similar reasons. Thus, the power contact diffusions are still kept only within approximately 2 mils of the nearest major outline sides and the signal contact diffusions are still only slightly under 1 mil in diameter and are still kept only within approximately two mils of the nearest major outline side.

In these circumstances, as noted earlier, there is a degradation in the performance parameters. The separation in the surface of the silicon shown in FIG. 2 between the power contact diffusions is markedly reduced thereby lowering the resistance occurring between these diffusions. Further, the signal contact diffusions use a considerably larger fraction of the Hall element area occurring between the power contact diffusions tend to short out a portion of the center of this Hall element sensing area. The result is that the sensitivity of Hall element 30 drops to only about 4 millivolts per kilogauss-volt and the resistance between the power contact diffusions is only approximately one-half square in sheet resistance terms.

Figure 7:
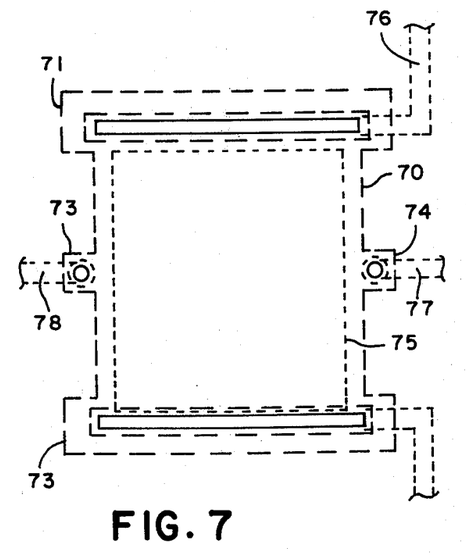

A final difficulty with the Hall element design of both FIGS. 1 and 2, is that there is a substantial current flowing outside the signal contact diffusions, i.e. between the signal contact diffusions and the nearest Hall element major outline side. Thus, part of the Hall element voltage output signal is not detected and is so lost thereby reducing sensitivity. This latter difficulty can be circumvented to an extent by modifying the conventional Hall element major outline slightly as shown in FIG. 7 and discussed below.

Figure 3:
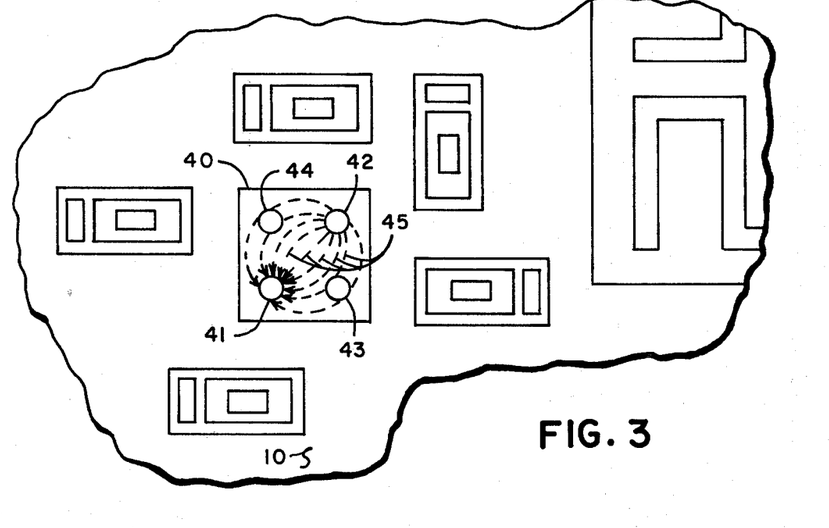
FIG. 3 shows the top view of a portion of a different monolithic integrated circuit having the same omissions as the FIG. 1 but showing an embodiment of the present invention.

A substantial improvement in Hall element design is shown in FIG. 3 where the sensitivity and resistance of FIG. 1 is retained but the area reduction achieved in FIG. 2 is also present. There, a Hall element, 40, is shown having power contact diffusions designated 41 and 42 and signal contact diffusions designated 43 and 44. Note that now power contact diffusions 41 and 42 have a relatively small dimension in parallel with the separation length between signal contact diffusions 43 and 44, when compared therewith, resulting in current paths substantially changed from those in FIG. 1 and 2 as indicated by the illustrative current paths designated 45 in FIG. 3. Further to be noted, is that Hall element 40, while again having its major outline in a quadrilateral figure, has the sides of that major outline parallel and perpendicular to the sides of the other component devices in the surface shown thereby facilitating component device "packing" in that surface.

The current flow in operation, as indicated by illustrative paths 45, will be relatively large along the shortest distance between power contact diffusions 41 and 42, i.e. along the separation length in the surface shown in FIG. 3 between the power contact diffusions, because the relatively short distance along this path means a lower resistance along it. Lesser and lesser amounts of current flow along the remaining current paths shown as one gets further and further from the separation length path between power contact diffusions 41 and 42. Those paths which pass through signal contact diffusions 43 and 44 beyond, i.e. paths between signal contact diffusions 43 and 44 and the vertices in the major outline of the Hall element to which they are closest, have relatively little current flowing along them because of the much greater length of these paths compared to the separation length path leading to a concomitant greater resistance. This results in two benefits: first, signal contact diffusions 43 and 44 act to short relatively little current because of the relatively small current flowing along the outer current paths.

Secondly, nearly all of the Hall element output voltage is developed between signal contact diffusions 43 and 44 since nearly all the current which flows from power supply contact diffusion 41 to supply contact diffusion 42 flows also between signal contact diffusions 43 and 44, i.e. nearly all this current flows across the separation length between signal contact diffusions 43 and 44. One disadvantage is that a slightly greater portion of the current flow between the power contact diffusions 43 and 44 does not flow parallel to the separation length between these diffusions and so slightly increases the electrical response to applied stress which response is minimal for only that current flowing parallel to the (110) crystallographic direction in surface shown (the [100] plane) i.e. for current flowing parallel to this separation length.

The Hall element of FIG. 3 was constructed having an area of only 42 square mils, obtained by having the major outline dimensions of about 6.5 mils on a side. Despite using only this small area, a sensitivity of approximately 6 millivolts/kilogauss-volts was achieved with a resistance of again approximately one square in sheet resistance terms. Further, this is achieved with the separation length between power contact diffusions 41 and 42 being approximately equal to the separation length between signal contact diffusions 43 and 44.

Figure 4:
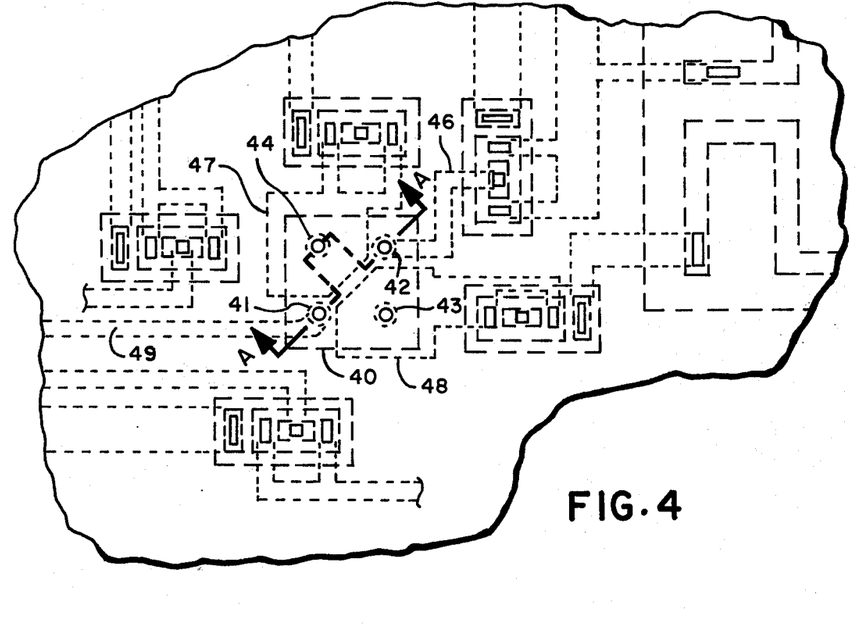
FIG. 4 shows the top view of the same monolithic integrated circuit portion shown in FIG. 3 but with fewer omissions.

FIG. 4 shows again the monolithic integrated circuit portion of FIG. 3, but with an insulating layer provided over the silicon surface shown in FIG. 3 as is the typical result from constructing such a monolithic integrated circuit using the usual methods. This insulating layer would typically be silicon dioxide. Thus, the major outline of the component devices of FIG. 3, now being below the insulating layer, are shown in FIG. 4 by dashed lines with openings in the insulated layer shown by solid lines. Shown by dotted lines are those areas over which there would be provided portions of the interconnection metallization network which would contact, through the openings in the insulating layer, various diffused and undiffused regions inside the major outlines of the component devices to form a completed component electrical device interconnection pattern for the effective electrical circuit in the monolithic integrated circuit.

All of the major outlines of the component devices are shown as quadrilateral figures or more particularly rectangles and squares. There has been no effort made in FIGS. 3 and 4 to show the improved surface area utilization which can result from the Hall element design shown thereby showing the packing in of as many transistors or resistors as possible around the periphery of the Hall element. Clearly, however, the paralleling of the sides of these component devices will improve surface area usage.

The metallization portions shown in FIG. 4 for contacting Hall element 40 serve, in part, a purpose beyond mere component device interconnection. Hall element 40 power contact metallization portions, the locations of which are designated 46 and 49, are intended to provide primarily electrical interconnection to other portions of the monolithic integrated circuit and to form ohmic contacts with power contact diffusions 41 and 42, and thereby contact Hall element 40. They are therefore ordinary monolithic integrated circuit interconnection network members. The metallization portion for location 46 is seen to form an ohmic contact with power contact diffusion 42 and to interconnect Hall element 40 thereby to an emitter of a nearby transistor by forming an ohmic contact therewith. The metallization portion for location 49 also forms an ohmic contact with power contact diffusion 41 but is shown truncated as the view in FIG. 4 as only a portion of the monolithic integrated circuit is shown.

The metallization portions for locations 47 and 48, however, not only provide ohmic connections to the signal contact diffusions 43 and 44, serving thereby to interconnect Hall element 40 with other component devices in the monolithic integrated circuit, but are also shown to substantially cover that portion of the insulating layer which is covering in turn Hall element 40. Thus, the metallization portion for location 47 forms an ohmic contact with signal contact diffusion 44 and an ohmic contact with the base of an adjoining transistor. Also, it is enlarged to approximately cover that portion of the insulating layer which covers what is the left-hand and upper triangular half of Hall element 40, as would be set off by the separation length between power contact diffusions 41 and 42 as shown in FIG. 4. The metallization interconnection portion for location 48 is provided similarly, Neither of these metallization interconnection portions for locations 47 or 48 in any way contact metallization interconnection portions 46 and 49 involved in supplying power to Hall element 40 and neither do they come into contact with one another.

This enlarging of the interconnection metallization portions for locations 47 and 48 beyond what would be required merely to form an ohmic contact with signal contact diffusions 43 and 44 is done to reduce or eliminate slow changes in the Hall element output voltage appearing between these metallization interconnection portions for locations 47 and 48. These slow changes in the output voltage appear to be due to a change in the offset voltage component of this Hall element output voltage.

The long term stability of the output voltage is much improved by covering the insulating layer over the Hall element 40 with these enlargements of the metallization interconnection portions for locations 47 and 48. The slow changes in the output voltage over time, particularly when the monlithic integrated circuit is used at high temperatures, are thought to be due to drifting ions in the insulating layer being attracted to the power contacts assymetrically and to the signal contacts of Hall element 40, in the absence of these enlargements. This occurrence is due to the electric fields occurring between these contacts acting on these ions. Use of the enlargements of the metallization interconnection portions for locations 47 and 48 is thought to provide equipotential planes over most of the insulating layer occurring between the signal contacts and so to eliminate the electric field acting on the ions in the insulating layer. The metallization presence over the Hall element 40 is found not to affect the Hall element response to magnetic fields, at least when the aluminum is used for metallization.

Also, the metallization covering the insulating layer in the area approximately between the signal contacts and the power contacts need not be connected to the signal contacts but could be connected to the power contacts or to an altogether separate source of voltage potential. In these circumstances, the metallization covering can be set at a voltage potential which depletes the silicon material below the insulating layer of charge carriers to eliminate adverse effects at the interface between the silicon and the insulating layer should these effects degrade the performance of the Hall element. Some examples of these other connections are shown below in FIG. 6 and 7 and will be described below.

The enlargements of the metallization interconnection portions for locations 47 and 48 need not be provided for the monolithic integrated circuit, particularly Hall element 40, to operate properly at least in relatively short periods of operation, particularly at lower temperatures. Thus, the metallization interconnection portions for locations 47 and 48 could be provided without the enlargements, much as the metallization interconnection portions for locations 46 and 49, with the usually expected operation characteristics occurring in many circumstances. Use of the enlargements is only to promote long term stability and proper performance of the Hall element over the long term, particularly at high operational temperatures.

Figure 5:
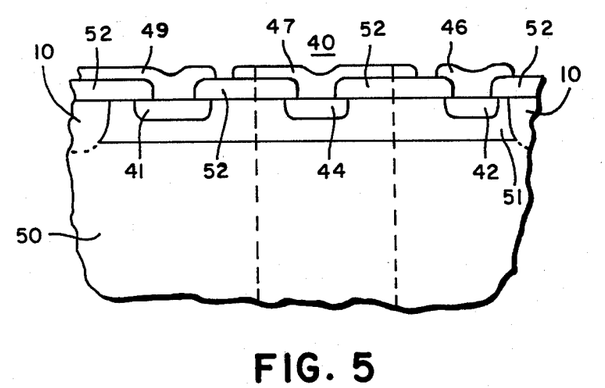
FIG. 5 shows a section view of FIG. 4 taken along section Line A—A in FIG. 4 but with still fewer omissions.

FIG. 5 is a section view of a portion of FIG. 4 to clarify the monolithic integrated circuit structure shown in that Figure. The section view is taken along section line A—A shown in FIG. 4. The portion of the monolithic integrated circuit shown in FIG. 5 is not complete along the sides nor on the bottom and so a broken line has been used to indicate that the view in FIG. 5 is truncated. The same numeral designations are used in FIG. 5 as are used in FIGS. 3 and 4 for designating the same structures there as they designate in these Figures.

A p-type conductivity substrate, 50, is shown in FIG. 5 having thereon the n-type conductivity epitaxial silicon layer, 51. Only a portion of the epitaxial layer 51 is shown and that is the portion corresponding to Hall element 40 which is shown as an n-type conductivity, junction isolated region where the isolation is due to the diffusion of p$^+$-type conductivity isolating regions 10. A silicon dioxide insulating layer, 52, is shown on epitaxial layer 51.

The section line A—A has been placed so that the n$^+$-type conductivity power contact diffusions 41 and 42 can be seen in FIG. 5 as well as signal contact diffusion region 44, also of n$^+$-type conductivity. Forming an ohmic contact with diffusion region 41 is the metallization interconnection portion for location 49, forming an ohmic contact with diffusion region 42 is the metallization interconnection portion for location 46 and forming an ohmic contact with diffusion regions 44 is metalization interconnection portion for location 47. The metallization portions are shown in FIG. 5 even though omitted in FIG. 4. The vertical dashed lines in FIG. 5 represent the breaks in section line A—A shown in FIG. 4. The deviation in section line A—A was made to have signal contact diffusion 44 appear in FIG. 5 and the vertical dashed lines in FIG. 5 have no structural significance. Metallization interconnection portion for location 47 lies between and on either side of these vertical dashed lines in accord with the enlargement thereof as set out above.

Figure 6:
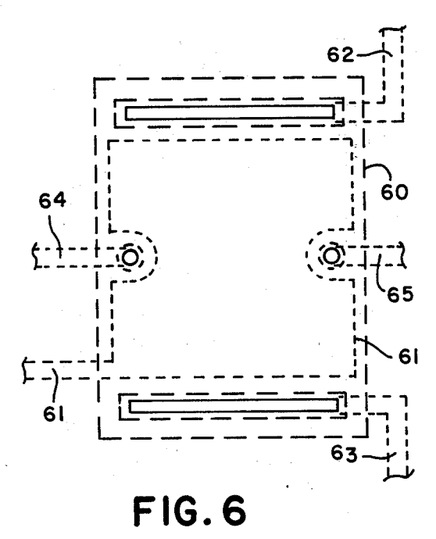
FIGS. 6 and 7 show top views of component devices which are, for purposes of metallization, alternatives to a component device shown in FIG. 4.

As stated above, the metallization portion or portions covering the insulating layer above the Hall element need not be connected to the Hall element signal contacts. Also, such use of metallization portions to improve long term stability is not confined to being used with the Hall element design shown in FIGS. 3 and 4, but can be used just as well with the conventional Hall element designs shown in FIGS. 1 and 2. Thus, FIG. 6 shows a Hall element, 60, of conventional design with a metallization interconnection portion for location 61 intended to have its voltage potential level determined by other component devices in a monolithic integrated circuit. Note that metallization for location 61 does not directly contact either the power metallization portions for locations 62 or 63, nor does it directly contact either of the signal metallization portions for locations 64 or 65.

FIG. 7 shows another Hall element, 70, which departs from conventional design by having the ends of the Hall element, 71 and 72, for the power contacts widened beyond the primary width of the element to accept wider power contacts to thereby provide a substantially uniform current flow across the primary width of the Hall element. Further, the Hall element 70 has widened portions, 73 and 74, on either side at approximately the middle of its length wherein diffusions for the signal contacts are provided. The result is that the signal contacts will be at the extremes of the active Hall element area to sense the full Hall element voltage output available.

In FIG. 7, the metallization for location 75 is over the active sensing area of the Hall element and is shown as a part of the metallization interconnection portion serving as one of the Hall element power contacts. The metallization interconnection portion for location 75 does not directly connect the other Hall element power contact, to be in location 76, or either of the signal contacts to be in locations 77 or 78.

In both FIGS. 6 and 7, the Hall element is shown with an insulating layer over the silicon epitaxial layer in which the Hall element is provided. Thus, the Hall element is shown in dashed lines and the openings in the insulative layer are shown as solid lines. The locations in which the metallization interconnection portions would be provided are shown in dotted lines.

The embodiments of the invention in which an exclusive property or right is claimed are defined as follows:
1. A Hall effect magnetic sensor, provided as a thin plate having a major surface, with said magnetic sensor sensitive to magnetic fields directed into said major surface, said magnetic sensor comprising:
   first and second power contacts each in electrical contact with said major surface effectively over first and second areas thereof, respectively, said first and second areas separated by a first separation length in said major surface with said first separation length directed along a first direction; and
   first and second signal contacts each in electrical contact with said major surface effectively over third and fourth areas thereof respectively, said third and fourth areas being separated by a second separation length in said major surface with said second separation length directed along a second direction, with each of said first and second areas having a relatively small extent along substantially said second direction as compared with said second separation length.
2. The apparatus of claim 1 wherein said thin plate is a portion of a semiconductor material layer provided in a monolithic integrated circuit, said first direction being such that if electrical current is introduced along said first separation length a substantially minimal electrical response will be obtained between said first and second signal contacts in response to longitudinal stress applied to said monolithic integrated circuit.

3. The apparatus of claim 1 wherein said thin plate has an electrically insulating material layer provided thereover with that portion of said insulating material layer which is over said thin plate having a first metal layer provided at least partially thereover, said first metal layer being electrically connected to permit a selected voltage potential to be provided thereon.

4. The apparatus of claim 2 wherein said semiconductor material layer hae at least one other component device provided in a portion thereof having its major outline in substantially a first quadrilateral figure, said other component device having sides of said first quadrilateral figure lying either substantially parallel or substantially perpendicular to a third direction in said major surface, said third direction being neither parallel nor perpendicular in said major surface to said first direction.

5. The apparatus of claim 2 wherein there is a third direction in said major surface along which said semiconductor material layer can be cleaved relatively easily, said third direction being neither parallel nor perpendicular in said major surface to said first direction.

6. The apparatus of claim 3 wherein said first metal layer covers only a part of said portion of said insulating material layer, and a second metal layer is also provided over another part of said portion of said insulating material layer and is electrically connected so as to permit a selected voltage potential to be provided thereon.

7. The apparatus of claim 4 wherein said third direction is substantially parallel to a direction in said monolithic integrated circuit along which said semiconductor material can be cleaved relatively easily.

8. The apparatus of claim 5 wherein said thin plate has its major outline in substantially a first quadrilateral figure and two sides of said first quadrilateral figure are substantially parallel to each other and to said third direction and two other sides of said first quadrilateral figure are substantially parallel to each other but substantially perpendicular to said third direction.

9. The apparatus of claim 6 wherein said first metal layer is electrically connected to said first signal contact and said second metal layer is electrically connected to said second signal contact.

10. The apparatus of claim 7 wherein said thin plate has its major outline in substantially a second quadrilateral figure and two sides of said second quadrilateral figure are substantially parallel to each other and to said third direction and two other sides of said second quadrilateral figure are substantially parallel to each other but substantially perpendicular to said third direction.

11. The apparatus of claim 10 wherein said semiconductor material layer is an epitaxial layer of a first conductivity type provided on a semiconductor material substrate of an opposite conductivity type and said thin plate is provided by junction isolation in said semiconductor material layer, as is said other component device, such that said thin plate has characteristics of a two terminal monolithic integrated circuit resistor between said first and second power contacts, said first and second power contacts and said first and second signal contacts being parts of a metallization interconnection network with said first and second areas capable of being contained in a circular figure of a selected diameter which is relatively small as compared with said second separation length.

12. A Hall effect magnetic sensor, provided in a monolithic integrated circuit in a first semiconductor material layer, with said magnetic sensor having its major outline in substantially a first quadrilateral figure in a first major surface of said first semiconductor material layer and with said magnetic sensor sensitive to magnetic fields directed into said first major surface, there being also at least one other component device provided in a second semiconductor material layer having its major outline in substantially a second quadrilateral figure in a second major surface of said second semiconductor material layer of semiconductor material, said magnetic sensor comprising:

first and second power contacts each in electrical contact with said first major surface effectively over first and second contact areas thereof, respectively, said first and second areas separated by a first separation length in said first major surface with said first separation length directed along a first direction;

first and second signal contacts each in electrical contact with said first major surface effectively over third and fourth areas thereof, respectively, said third and forth areas being separated by a second separation length in said first major surface with said second separation length directed along a second direction, with each of said first and second areas having a relatively small extent along substantially said second direction compared with said second separation length; and said first direction being such that, if electrical current is introduced along said first separation length, substantially minimal electrical response will be obtained between said first and second signal contacts in response to longitudinal stress applied to said monolithic integrated circuit, there being two sides of each of said first and second quadrilateral figures substantially parallel to a third direction in said integrated monolithic circuit along which semiconductor material in said second semiconductor material layer can be cleaved relatively easily and two other sides each of said first and second quadrilateral figures being substantially perpendicular to said third direction.

13. The apparatus of claim 12 wherein said first and second semiconductor material layers are first and second portions respectively of an epitaxial layer of a first conductivity type provided on a semiconductor material substrate of an opposite conductivity type and said magnetic sensor is provided by junction isolation in said epitaxial layer, as is said other component device, such that said first portion of said epitaxial layer has characteristics of a two terminal monolithic integrated circuit resistor between said first and second power contacts, said first and second power contacts and said first and second signal contacts being parts of a metallization interconnection network and each of these said contacts being relatively close to a different vertex of said first quadrilateral figure when compared with said first and second separation lengths, said first and second areas being capable of being contained in a circular figure of a selected diameter which is relatively small compared with said second separation length.

14. The apparatus of claim 13 wherein said first portion of said epitaxial layer has an electrically insulating material layer provided thereover with that portion of said insulating material layer which is over said first portion of said epitaxial layer having a first metal layer provided at least partially thereover, said first metal layer being electrically connected to permit a selected voltage potential to be provided thereon.

15. The apparatus of claim 14 wherein said first metal layer covers only a part of said portion of said insulating material layer, and a second metal layer is also provided over another part of said portion of said insulating material layer and is electrically connected so as to permit a selected voltage potential to be provided thereon.

16. The apparatus of claim 15 wherein said first metal layer is electrically connected to said first signal contact and said second metal layer is electrically connected to said second signal contact.

17. A Hall effect magnetic sensor provided as a thin plate having a first major surface, said thin plate, absent external influences, having its conductivity determined throughout primarily by a single kind of effective charge carrier, with said magnetic sensor sensitive to magnetic fields directed through said first major surface, said sensor comprising:

first and second power contacts each in electrical contact with said first major surface effectively over first and second areas thereof, respectively;

first and second signal contacts each in electrical contact with said first major surface effectively over third and fourth areas thereof, respectively;

an electrically insulating material layer having a second major surface, said insulating material layer provided over said thin plate on said first major surface; and a first metal layer provided on a protected area in said second major surface which is over at least a part of that portion of said insulating material layer on said thin plate which is between said first and second power contacts and between said first and second signal contacts, said protected area being substantially larger than any of said first, second, third or fourth areas, said first metal layer being electrically connected so as to permit a selected voltage potential to be provided thereon.

18. The apparatus of claim 17 wherein said first metal layer covers only a part of said portion of said insulative layer which covers said thin plate and a second metal layer is also provided over another part of said portion of said insulative layer, said second metal layer being electrically connected so as to permit a selected voltage potential to be provided thereon upon energization of said magnetic sensor.

19. The apparatus of claim 17 wherein said thin plate is a portion of an epitaxial semiconductor material layer of a first conductivity type formed on a semiconductor material substrate of an opposite conductivity type and said thin plate is formed by junction isolation in said epitaxial semiconductor material layer.

20. The apparatus of claim 18 wherein said first metal layer is connected to said first signal contact and said second metal layer is connected to said second signal contact.

* * * * *